US007764940B2

(12) United States Patent
Dessert et al.

(10) Patent No.: US 7,764,940 B2
(45) Date of Patent: Jul. 27, 2010

(54) SYSTEM AND METHOD FOR DISCOVERING FREQUENCY RELATED SPURS IN A MULTI-CONVERSION TUNER

(75) Inventors: David Dessert, Wylie, TX (US); John Schneider, Frisco, TX (US)

(73) Assignee: Microtune (Texas), L.P., Plano, TX (US)

( * ) Notice: Subject to any disclaimer, the term of this patent is extended or adjusted under 35 U.S.C. 154(b) by 1212 days.

(21) Appl. No.: 11/325,854

(22) Filed: Jan. 5, 2006

(65) Prior Publication Data

US 2006/0116099 A1 Jun. 1, 2006

Related U.S. Application Data

(62) Division of application No. 10/319,118, filed on Dec. 13, 2002, now Pat. No. 7,035,614.

(51) Int. Cl.
*H04B 1/26* (2006.01)
(52) U.S. Cl. .................. 455/315; 455/313; 455/314; 455/325; 455/296
(58) Field of Classification Search ......... 455/313–326, 455/141, 147, 296, 85–87, 75–77, 114.2, 455/130, 165.1, 278.11, 208–209, 302, 255–259, 455/334, 260, 183.1, 154.1, 131; 348/726–733, 348/556
See application file for complete search history.

(56) References Cited

U.S. PATENT DOCUMENTS

| 5,519,890 | A | 5/1996 | Pinckley |
| 5,737,035 | A | 4/1998 | Rotzoll |
| 5,847,612 | A | 12/1998 | Birleson |
| 5,917,738 | A | 6/1999 | Pan |
| 6,118,499 | A | * | 9/2000 | Fang ........................... 348/726 |
| 6,308,056 | B1 | 10/2001 | Abe et al. |
| 6,370,360 | B1 | 4/2002 | Kunkel |
| 6,567,654 | B1 | * | 5/2003 | Coronel et al. ............... 455/315 |
| 6,725,463 | B1 | 4/2004 | Birleson |
| 6,861,968 | B2 | 3/2005 | Melanson et al. |
| 6,876,839 | B2 | * | 4/2005 | Harris ......................... 455/141 |
| 7,079,195 | B1 | 7/2006 | Birleson et al. |
| 7,437,134 | B2 | * | 10/2008 | Cowley et al. ........... 455/191.1 |

(Continued)

FOREIGN PATENT DOCUMENTS

CA 2296216 4/2001

(Continued)

OTHER PUBLICATIONS

U.S. Appl. No. 08/904,693, Vince Birleson.

(Continued)

*Primary Examiner*—Pablo N Tran
(74) *Attorney, Agent, or Firm*—Fulbright & Jaworski L.L.P.

(57) ABSTRACT

The present invention is directed to a system and method of reducing frequency interference in a circuit when the harmonics of at least two frequencies could cause interference when such harmonics interact with each other. In one embodiment, a determination is made as to which harmonic could possibly support such interference, and based upon the determined harmonic, determining which combination within said determined harmonic is likely to cause the interference.

20 Claims, 5 Drawing Sheets

U.S. PATENT DOCUMENTS

| | | |
|---|---|---|
| 7,447,493 B2 * | 11/2008 | Johnson .................. 455/334 |
| 2003/0068995 A1 * | 4/2003 | Louis et al. ............... 455/313 |
| 2003/0193923 A1 * | 10/2003 | Abdelgany et al. ......... 370/342 |
| 2004/0002318 A1 | 1/2004 | Kerth et al. |
| 2004/0264941 A1 | 12/2004 | Hirasaka |
| 2005/0047486 A1 | 3/2005 | Sakaue et al. |
| 2007/0053414 A1 | 3/2007 | Payne et al. |

FOREIGN PATENT DOCUMENTS

EP    1 248 360    10/2002

OTHER PUBLICATIONS

U.S. Appl. No. 09/572,393, Vince Birleson.

European Office Action issued for related counter-part European Application No. 03 796 894.8-2411; Dated Feb. 4, 2008; 6 Pages.

* cited by examiner

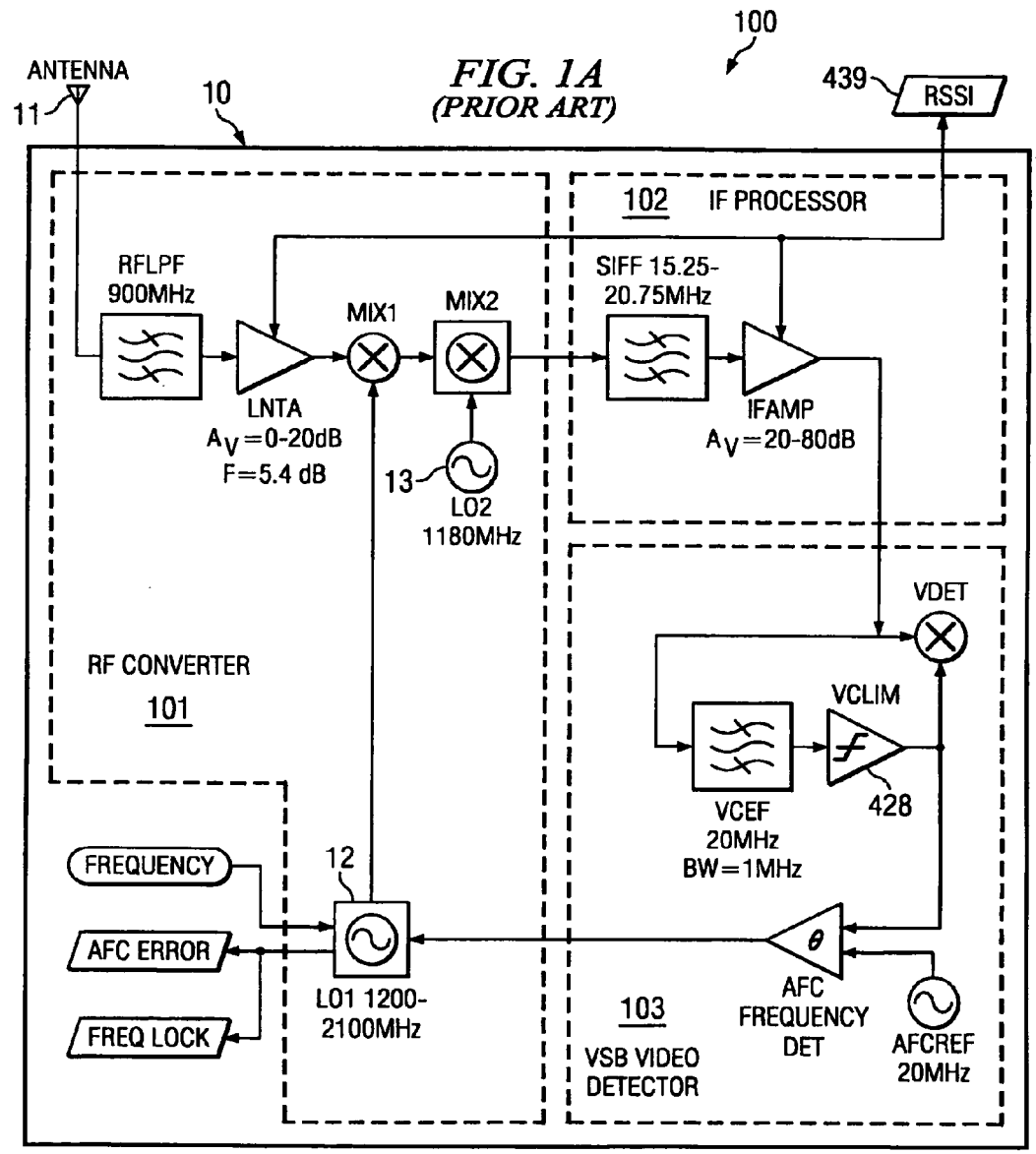
*FIG. 1A*
*(PRIOR ART)*
*FIG. 1B*
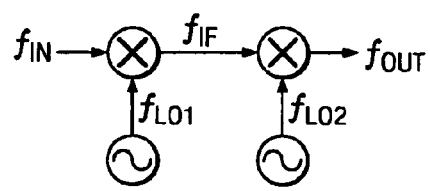

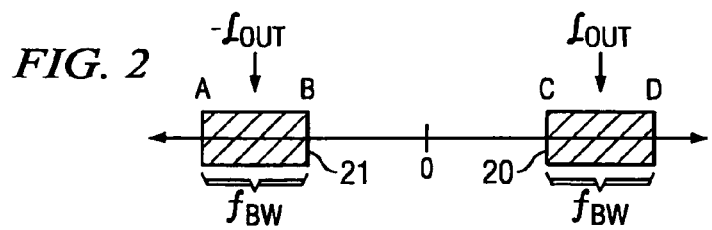

| | | | | | | Harmonics of $f_2$ | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Harmonics of $f_1$ | 1 | 113 | -1063 | -2239 | -3415 | -4591 | -5767 | -6943 | -8119 | -9295 | -10471 | -11647 | -12823 | -13999 | -15175 | -16351 |
| | 2 | 1402 | 226 | -950 | -2126 | -3302 | -4478 | -5654 | -6830 | -8006 | -9182 | -10358 | -11534 | -12710 | -13886 | -15062 |
| | 3 | 2691 | 1515 | 339 | -837 | -2013 | -3189 | -4365 | -5541 | -6717 | -7893 | -9069 | -10245 | -11421 | -12597 | -13773 |
| | 4 | 3980 | 2804 | 1628 | 452 | -724 | -1900 | -3076 | -4252 | -5428 | -6604 | -7780 | -8956 | -10132 | -11308 | -12484 |
| | 5 | 5269 | 4093 | 2917 | 1741 | 565 | -611 | -1787 | -2963 | -4139 | -5315 | -6491 | -7667 | -8843 | -10019 | -11195 |
| | 6 | 6558 | 5382 | 4206 | 3030 | 1854 | 678 | -498 | -1674 | -2850 | -4026 | -5202 | -6378 | -7554 | -8730 | -9906 |
| | 7 | 7847 | 6671 | 5495 | 4319 | 3143 | 1967 | 791 | -385 | -1561 | -2737 | -3913 | -5089 | -6265 | -7441 | -8617 |
| | 8 | 9136 | 7960 | 6784 | 5608 | 4432 | 3256 | 2080 | 904 | -272 | -1448 | -2624 | -3800 | -4976 | -6152 | -7328 |
| | 9 | 10425 | 9249 | 8073 | 6897 | 5721 | 4545 | 3369 | 2193 | 1017 | -159 | -1335 | -2511 | -3687 | -4863 | -6039 |
| | 10 | 11714 | 10538 | 9362 | 8186 | 7010 | 5834 | 4658 | 3482 | 2306 | 1130 | -46 | | | | |

SPUR EXISTS

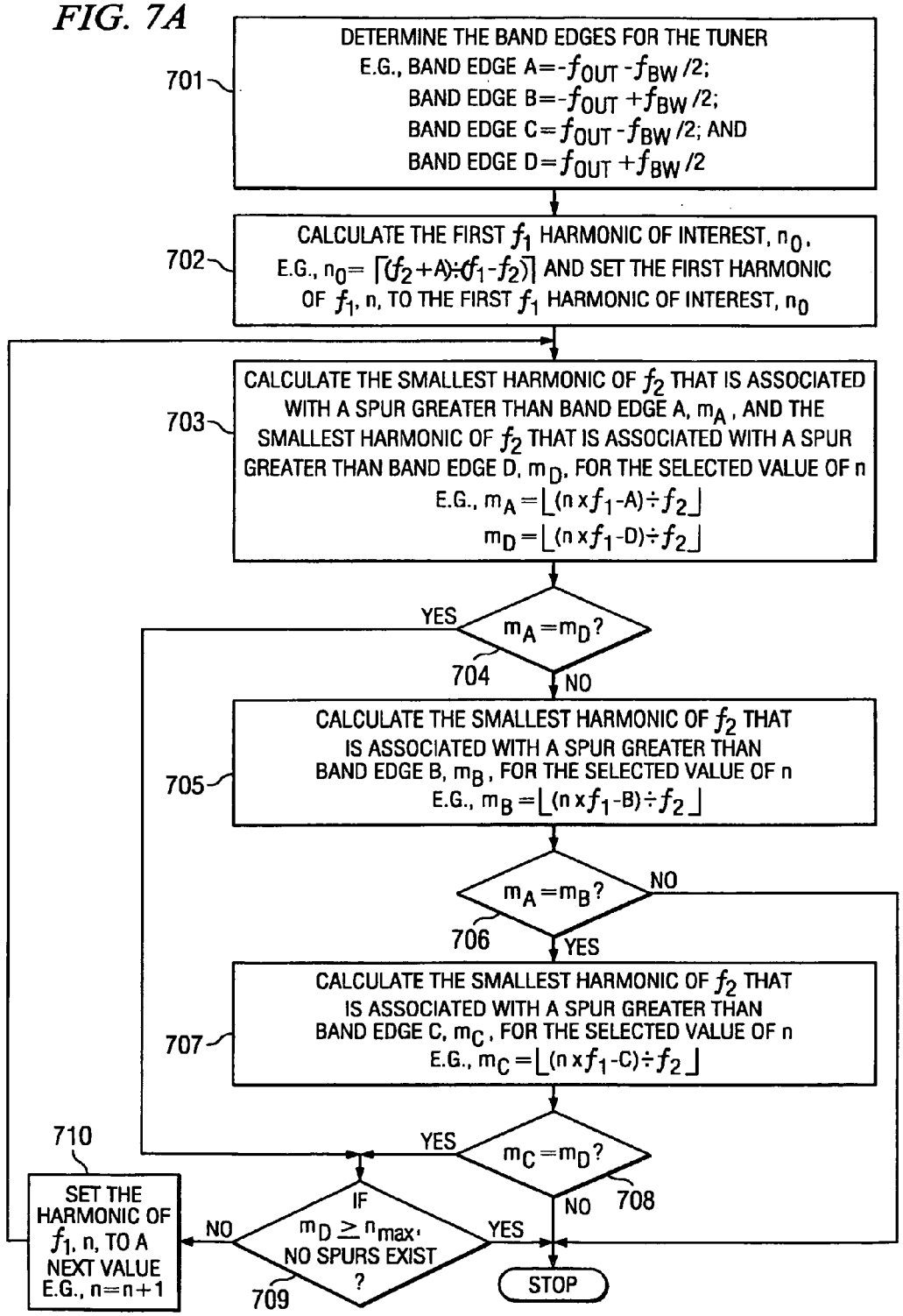

FIG. 7A

701 — DETERMINE THE BAND EDGES FOR THE TUNER
E.G., BAND EDGE A = $-f_{OUT} - f_{BW}/2$;
BAND EDGE B = $-f_{OUT} + f_{BW}/2$;
BAND EDGE C = $f_{OUT} - f_{BW}/2$; AND
BAND EDGE D = $f_{OUT} + f_{BW}/2$

702 — CALCULATE THE FIRST $f_1$ HARMONIC OF INTEREST, $n_0$.
E.G., $n_0 = \lceil (f_2 + A) \div (f_1 - f_2) \rceil$ AND SET THE FIRST HARMONIC
OF $f_1$, n, TO THE FIRST $f_1$ HARMONIC OF INTEREST, $n_0$ 703 — CALCULATE THE SMALLEST HARMONIC OF $f_2$ THAT IS ASSOCIATED
WITH A SPUR GREATER THAN BAND EDGE A, $m_A$, AND THE
SMALLEST HARMONIC OF $f_2$ THAT IS ASSOCIATED WITH A SPUR
GREATER THAN BAND EDGE D, $m_D$, FOR THE SELECTED VALUE OF n
E.G., $m_A = \lfloor (n \times f_1 - A) \div f_2 \rfloor$
$m_D = \lfloor (n \times f_1 - D) \div f_2 \rfloor$ 704 — $m_A = m_D$? YES / NO 705 — CALCULATE THE SMALLEST HARMONIC OF $f_2$ THAT
IS ASSOCIATED WITH A SPUR GREATER THAN
BAND EDGE B, $m_B$, FOR THE SELECTED VALUE OF n
E.G., $m_B = \lfloor (n \times f_1 - B) \div f_2 \rfloor$ 706 — $m_A = m_B$? NO / YES 707 — CALCULATE THE SMALLEST HARMONIC OF $f_2$ THAT
IS ASSOCIATED WITH A SPUR GREATER THAN
BAND EDGE C, $m_C$, FOR THE SELECTED VALUE OF n
E.G., $m_C = \lfloor (n \times f_1 - C) \div f_2 \rfloor$ 708 — $m_C = m_D$? YES / NO 709 — IF $m_D \geq n_{max}$, NO SPURS EXIST?

710 — SET THE HARMONIC OF $f_1$, n, TO A NEXT VALUE E.G., n = n+1

STOP

SYSTEM AND METHOD FOR DISCOVERING FREQUENCY RELATED SPURS IN A MULTI-CONVERSION TUNER

CROSS-REFERENCE TO RELATED APPLICATIONS

The present application is a divisional application of U.S. patent application Ser. No. 10/319,118, filed Dec. 13, 2002, entitled "System and Method for Discovering Frequency Related Spurs in a Multi-Conversion Tuner," the disclosure of which is incorporated herein by reference. The present invention is related to co-pending and commonly assigned U.S. patent application Ser. No. 08/904,693, entitled "Dual Mode Tuner for Co-Existing Digital and Analog Television Signals," filed Aug. 1, 1997; and Ser. No. 09/572,393, entitled "Broadband Integrated Tuner," filed May 16, 2000, the disclosures of which are hereby incorporated herein by reference in their entirety.

TECHNICAL FIELD

The invention relates generally to frequency interference calculations and more specifically to determining frequency related spurs in a multi-conversion tuner.

BACKGROUND

In a tuner or frequency converter (such as, for example, a dual-conversion tuner), an incoming signal at frequency $f_{IN}$ is mixed with a signal at frequency $f_{LO1}$ from a local oscillator (LO) to produce a signal at an intermediate frequency $f_{IF}$. This signal may then mixed with a signal at frequency $f_{LO2}$ from a second local oscillator signal to produce the desired output frequency $f_{OUT}$, in a dual conversion tuner configuration. This process is illustrated in FIG. 1A, which is a portion of one example of a tuner showing how the $f_{LO}$ signals (provided by LO 12 and 13) are mixed. Such a tuner is shown in U.S. Pat. No. 5,737,035, issued Apr. 7, 1998 hereby incorporated by reference herein. Typically, but not always, the frequency of first local oscillator, e.g., LO 12, is greater than that of second local oscillator, e.g., LO 13. That is, generally $f_{LO1} > f_{LO2}$. Accordingly, reference shall be made herein to equations in which it is assumed that $f_{LO1} > f_{LO2}$. However, it should be appreciated that the formulae herein are applicable to situations in which $f_{LO2} > f_{LO1}$, such as by replacing $f_{LO1}$ with $f_{LO2}$ and replacing $f_{LO2}$ with $f_{LO1}$ in situations where $f_{LO2} > f_{LO1}$.

FIG. 1B shows a simplified diagram of two mixing stages with the filtering omitted. These filters ultimately determine final bandwidth ($f_{BW}$) of the tuner, but since they do not contribute to the production of LO-related spurs, they are omitted from FIG. 1B.

An adverse effect of the dual conversion process is the introduction of LO-related spurs into the tuned signal. These spurs are created by combinations of the harmonics of the LO frequencies used ($f_{LO1}$ and $f_{LO2}$).

The frequency of each of the LO-related spurs can be calculated as:

$$f_{SPUR} = n \times f_1 - m \times f_2 \quad (1)$$

where n and m are integer numbers representing, respectively the harmonics of the high and low local oscillator frequencies, and $f_1$ and $f_2$ are the local oscillator frequencies (e.g., $f_{LO1}$ and $f_{LO2}$, respectively where $f_{LO1} > f_{LO2}$). If any spur generated by a given combination of $f_{LO1}$ and $f_{LO2}$ falls within the output bandwidth ($f_{BW}$) of the converter/tuner, that spur can degrade the quality of the output signal. If a spur does exist within the desired output bandwidth, the LO frequencies can be adjusted to different values to avoid the spur falling within the output band. As manufacturing processes produce denser and faster IC's, the number of harmonics ($n_{MAX}$) that must be considered continues to increase. Since the number of LO frequency combinations that can possibly create spurs in n harmonics is $n^2$, the amount of resources required to avoid the spurs increases dramatically as technology improves. As an example, at the time the circuit shown in FIG. 1A was initially produced, the number of harmonics (n) that were typically taken into consideration was 5. Currently, the number of harmonics typically taken into consideration is on the order of 15.

One reason why it is important to avoid LO spurious products is that a spur which is generated by multiples of $f_{LO1}$ and $f_{LO2}$ in a double conversion system will often have a power level which is much greater than the actual RF signal. Therefore, if a spur caused by a product of $f_{LO1}$ and $f_{LO2}$ falls in the desired IF output pass band, its amplitude (power level) may be larger than the IF output level of the original desired signal, corrupting the performance of the mixer itself.

One of the fixes for this problem is that when it is known that a certain spur (such as a spur associated with two times the first LO and three times the second LO) will fall within the output pass band, the LO frequencies can be changed (up or down) a certain amount, which will, in effect, still allow the circuit to tune to the desired output frequency, but the spur will be moved up or down and outside of the output bandwidth of the tuner.

Accordingly, one method for identifying spurs falling within a particular band, such as the tuner output band, is to look at all the harmonics of the first LO, mixed with all the harmonics of the second LO and, one by one, check off each one. Thus, if a circuit designer is looking up to the 15$^{th}$ harmonic of the first LO and the 15$^{th}$ harmonic of the second LO, the designer checks one times $f_{LO1}$ (first harmonic) and one times $f_{LO2}$ (first harmonic) to see if there is a spur of concern. If there is no spur of concern, then the designer continues with one times $f_{LO1}$ (first harmonic) and two times $f_{LO2}$ (second harmonic) to see if there is a spur of concern. If not, then the process continues with one times $f_{LO1}$ (first harmonic) and three times $f_{LO2}$ (third harmonic) to see if there is a spur of concern. Once all harmonics of $f_{LO2}$ have been considered, the harmonic of the first LO frequency may be incremented and each harmonic of the second LO frequency again considered. That is, the designer continues with two times $f_{LO1}$ (second harmonic) and one times $f_{LO2}$ (first harmonic) to see if there is a spur of concern, and so on. This results in $n^2$ combinations being looked at. This is a time consuming method. Even assuming that the mathematics of how spurs are generated allows for the elimination of quite a few of the coefficients for the first and second LO, the operation remains essentially an $n^2$ operation.

It should be appreciated that spur identification and avoidance as discussed above is dependent on the circuit that is being used and which spurs might come through the chip more strongly than other spurs. It is also dependent on the input frequency and on all the specific channels that might be on the input frequency. That method is also specific to the first IF frequency and to the output frequency. Thus, for each application of a circuit the chip designer generally must employ a unique program for each channel input lineup in the desired frequency spectrum. This then implies that a different spur avoidance algorithm must be created for every customer application, i.e., each tuner implementation.

BRIEF SUMMARY

The present invention is directed to systems and methods of reducing interference in a circuit resulting from harmonics of oscillator frequencies. In one embodiment, a determination is made as to a band or bands in which harmonics could possibly result in interference and determining which combination of LO frequencies result in harmonics not falling within the determined band or bands. Preferred embodiments leverage the fact that harmonics of a particular frequency are evenly spaced to avoid examining all of the possible harmonics. For example, rather than calculate every harmonic and check that each calculated harmonic does not fall within the determined band or bands, embodiments of the present invention determine the smallest harmonics that are greater than each edge of the determined band or bands. An interfering spur, a difference of the LO harmonics falling within the band or bands, may be determined to exist where the smallest harmonic difference for a particular LO harmonic that is greater than a first edge of a determined band is not equal to the smallest harmonic difference for the particular LO harmonic that is greater than a second edge of the determined band.

Accordingly, in one embodiment, the number of calculations used to find spurs that may interfere in a dual-conversion tuner is reduced by calculating which spurs are of possible interest for each of the LO harmonics. Usually, the number of possible spurs which could possibly cause interference is reduced to only two for each LO harmonic, so the absolute order of calculations as well as the number of calculations become a number times n operation instead of a $n^2$ operation.

In one embodiment, methods of the present invention eliminate several sets of harmonics as producing differences which cannot result in spurs within the band or bands of interest, and thereby results in a further reduced set of calculations. Thus, (assuming 15 harmonics), rather than having to look at 15 times 4 sets of numbers, embodiments of the invention may only look at 5 harmonics and ignore the remaining 10. For example, by observing the actual value of the calculated numbers, a user or control system may stop the spur analysis without calculating all harmonic product values.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1A is a prior art dual conversion tuner;

FIG. 1B is a simplified diagram of two mixing stages, with filtering omitted, of a prior art dual conversion tuner;

FIG. 2 illustrates the bands of frequencies within which extraneous signals such as spurs are not desirable;

FIG. 3 illustrates where the spurious signals from one LO harmonic lie with respect to the frequency bands shown in FIG. 2;

FIG. 4 illustrates how calculated frequencies fall inside or outside the critical bands;

FIG. 6 shows the results of searching for spurs using concepts of the present invention;

FIG. 7A shows one embodiment of a method of practicing concepts of the present invention;

DETAILED DESCRIPTION

Figures 5, 8:
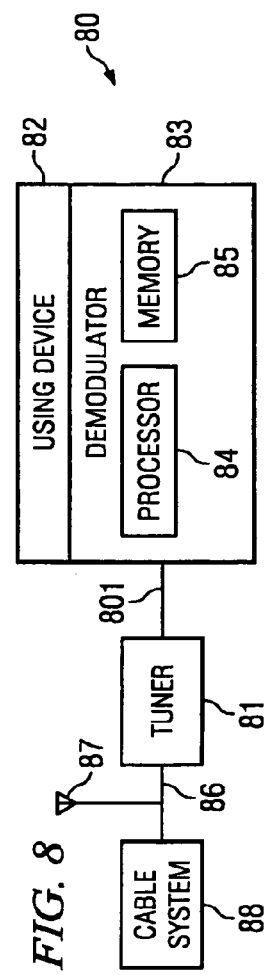
FIG. 5 shows the results of searching for spurs using prior art methods.
FIG. 8 shows one embodiment of a system using the concepts of the present invention.

Equation (1) (above) is the starting point for calculation of a spur. As shown, n is a harmonic (1, 2, 3, etc.) of $f_1$, e.g., $f_{LO1}$, and m is a harmonic of $f_2$, e.g., $f_{LO2}$. The spur equation then is the product of n $f_{LO1}$ minus the product of m $f_{LO2}$.

There is a practical limit to how many harmonics (n, m) are capable of causing interference, e.g., due to the signal level of the spur and/or the frequency of the spur. The number of harmonics which are candidates for producing interfering spurs for any particular tuner circuit depends upon such factors as how fast the process used to fabricate the tuner is and/or how high a frequency the tuner is designed to handle. Faster processes generally suggest larger harmonics should be considered. However, spurs which fall outside the IF output pass band are typically not of concern.

Different circuits, and different applications, have different pass bands. One such pass band, such as often utilized in television signal processing, is 44 MHz. Accordingly, in such circuits there should be some bandwidth around the output center frequency, e.g., 6 MHz around the 44 MHz video signal pass band, which should not have spurs. For example, 44 plus 3 megahertz and 44 minus 3 megahertz may define a range which should be free of LO spurs because that is where a demodulator is looking for a clean signal to process and use. Based on this example, a system or system designer looks for integer harmonics of the tuner LO frequencies that will generate spurs in the range of 41 MHz to 47 MHz, and the image band −41 MHz to −47 MHz. As discussed, it is current practice to check as many as 15 harmonics, thus n and m range from 1-15.

FIG. 2 illustrates the output band 20 (and its image 21) of a converter/tuner. Any $f_{SPUR}$ that falls within the shaded ranges is of concern and most likely undesirable.

FIG. 3 shows a graphical representation of the spurs (spurs 31-36) that result for a specific harmonic (n) of a first LO frequency (e.g., $f_1=f_{LO1}$) and six harmonics (m=−1, m=−2, m=−3, m=−4, m=−5, m=−6) of a second LO frequency (e.g. $f_2=f_{LO2}$). These spurs may be calculated using Equation (1). In the example shown in FIG. 3, there are no interfering spurs associated with the $n^{th}$ harmonic of $f_1$ ($f_{LO1}$) when combined with the 6 illustrated harmonics of $f_2$ ($f_{LO2}$). Moreover, it can be seen that many of the spurs are displaced in frequency far enough from the bands of interest (output band 20 and image 21) so as to present no real issue with respect to interference, and therefore needlessly consume computing resources in their calculation.

The fact that the LO-related spurs are evenly spaced may be used according to the embodiments of the invention to avoid having to examine all of the possible harmonics and their spur. Rather than calculate spurs for every harmonic and then check to be sure that the calculated spur does not fall within the output bandwidth (or its image), it is possible to determine for each/any particular harmonic of $f_1$ the smallest harmonic of $f_2$ that produces a spur greater than each edge of bands 20 and 21, (edges A, B, C, and D). If the smallest harmonic of $f_2$ which results in a spur larger than one edge of a band (e.g., edge C of band 20) is not equal to the smallest harmonic of $f_2$ which results in a spur larger than the other edge of the band (e.g., edge D of band 20), then at least one spur falls between the two band edges, that is, a spur exists in the band.

The frequencies of the output band edges discussed above may be represented as (where $f_{BW}$ is the bandwidth of the output band):

$$A=-f_{OUT}-f_{BW}/2 \quad (2)$$

$$B=-f_{OUT}+f_{BW}/2 \quad (3)$$

$$C=f_{OUT}-f_{BW}/2 \quad (4)$$

$$D=f_{OUT}+f_{BW}/2 \quad (5)$$

For a given harmonic n of $f_1$, the exact multiple of $f_2$ that is associated with a spur coinciding with each band edge can be calculated. The multiple that corresponds for point A, for example, can be calculated as (substituting A as defined in equation (2) for $f_{SPUR}$ of equation (1) and solving for m)

$$m_A=(n\times f_1+f_{OUT}+(f_{BW}\div 2))\div f_2 \quad (6)$$

Since we are only interested in integer values of m, we can apply the floor function ($\lfloor m_A \rfloor$) to this value to, determine the smallest integer harmonic of $f_2$ that is associated with a spur greater than band edge A. The equations to determine such an integer value for each of the band edges are:

$$m_A=\lfloor (n\times f_1-A)\div f_2 \rfloor \quad (7)$$

$$m_B=\lfloor (n\times f_1-B)\div f_2 \rfloor \quad (8)$$

$$m_C=\lfloor (n\times f_1-C)\div f_2 \rfloor \quad (9)$$

$$m_D=\lfloor (n\times f_1-D)\div f_2 \rfloor \quad (10)$$

The above 4 harmonics of $f_2$ may be analyzed according to the present invention to determine if spurs resulting from harmonics of $f_2$ and a particular harmonic (n) of $f_1$ correspond to band 20 or 21. If $m_A \neq M_B$ or $m_C \neq m_D$ then an LO-related spur falls within the output bandwidth of the tuner.

Assume by way of example, that $m_A$ before applying the floor function computes to be a number, such as 5.3, and $m_B$ computes to be another number, such as 5.2, when considering the $2^{nd}$ harmonic of $f_1$. Taking the floor of 5.3 and 5.2, yields 5 for both $m_A$ associated with edge A and $m_B$ associated with edge B. Accordingly, analysis of $m_A$ and $m_B$ provided according to embodiments of the invention may conclude that no spur is present in band 21 associated with the $2^{nd}$ harmonic of $f_1$, in combination with the harmonics of $f_2$. This can be seen graphically in FIG. 4, where the $5^{th}$ harmonic of $f_2$ when combined with the $2^{nd}$ harmonic off produces a spur (spur 45) which is both the smallest harmonic of $f_2$ less than A and B and, therefore, does not show up between points A and B. Saying this another way, there was no whole number transition between the spurs associated with the edges of the band, so no spurs will show up between points A and B.

Another way to look at the spur analysis described above would be to say that the A, B, C and D edge values are known for any particular system. Since back edge frequency A is known, and n (the harmonic of $f_1$) is fixed for a particular set of spurs, a value of m (the harmonic of $f_2$) which would cause a spur to happen at A can be calculated. In this calculation, m need not be a whole number, or an integer number, but rather an exact calculation of what that number is. Equation (6) calculates m for frequency A (for the above example, m was 5.3). Equation (7) takes the floor of that calculation to arrive at an integer value since a harmonic is present only at integer multiples of a particular frequency (in the example applying the floor function to 5.3 provides 5). Because there is no transition in the calculated harmonic values for band edge A and band edge B (i.e., $m_A=m_B$) there can be no LO-related spur within the band defined by band edge A and band edge B.

However, in FIG. 4 by way of example, it can be seen that the spur related to the second harmonic of $f_1$ and the third harmonic of $f_2$ falls within band 20 of concern. When the equations above are used to calculate the smallest harmonics having spurs greater than the band edges C and D, $m_C=3$ and $m_D=2$, indicating a transition in the calculation harmonic values for edge band C and edge band D (i.e., $m_C \neq m_D$). This indicates that a spur exists in band 20, even without calculating the frequency of the spur. Accordingly, it can readily be appreciated that embodiments of the present invention provide an expedient technique for recognizing combinations of LO frequencies having undesired spurs associated therewith.

Moreover, the floor function used according to preferred embodiments of the invention allows for a fixed point integer operation since it is not important to the spur determination what the fractional part is. Accordingly, the divide according to embodiments of the invention, may be implemented as an integer divide, which is a function that most CPUs provide and therefore is readily implemented. It should be appreciated that, although the example above discussed calculations with respect to a single particular harmonic of the first frequency ($f_1$), embodiments of the present invention perform such calculations for a series of first frequency harmonics. For example, n may be selected to be 1 ($1^{st}$ harmonic of $f_1$) and the above calculations and analysis of $m_A$, $m_B$, $m_C$, and $m_D$ performed. If the presence of undesired spurs is not identified, n may be incremented (such as 2, corresponding to a $2^{nd}$ harmonic of $f_1$) and the above calculation and analysis of $m_A$, $m_B$, $m_C$, and $m_D$ performed, and so on.

Embodiments of the present invention may further optimize the calculations and analysis performed in determining the presence of spurs. For example, some embodiments of the invention operate to calculate $m_A$ and $m_D$ to determine if a transition (spur) happens between them as a threshold determination for further analysis of a set of harmonics. If a spur does occur between distal band edges A and D, then the system may proceed to calculate proximal band edges B and C for further analysis. For example, if the transition occurred between proximal edges B and C it could not occur between band edges A and B (band 21) or band edges C and D (band 20). Note that the charts shown in FIGS. 3 and 4 are for discussion purposes only and in reality the distance between A and D is in the order of 70-90 megahertz for a video signal processing system, while the distance between 1 times $f_2$ and 2 times $f_2$ is around 1200 megahertz for such a video signal processing system. Accordingly, the chance of a spur actually falling between A and D is slight (about 7%). Thus, this embodiment can shorten the number of computations (reducing the number of computations by half about 93% of the time) by initially looking at just points A and D.

It should be appreciated that, although embodiments have been described herein with reference to use of the floor function, it is also possible to use the ceiling function for the same purpose. Such embodiments of the invention calculate the largest harmonic that is less than the band edge using the ceiling function, with the comparisons between the $m_X$ values remaining as described above.

By using the concepts taught herein, one need only calculate, at most, four values for each $n \times f_1$ value, regardless of how many harmonics ($n_{MAX}$) are to be considered. In addition, since the value of $n \times f_1$ increases as n increases, if the values of n are considered in increasing order, when the calculated value of $m_D$, the largest $m_X$ quantity, equals or exceeds $n_{MAX}$ ($m_D \geq n_{MAX}$) then there are no more combinations of $n \leq n_{MAX}$ and $m \leq n_{MAX}$ which could produce interfering spurs. It is, thus, not necessary to examine any additional harmonics of $f_1$.

As an example of the improved efficiency of this algorithm, consider a tuner with an output frequency of 44 MHz, where the local oscillators are tuned to $f_{LO1}=f_1=1289$ MHz and $f_{LO2}=f_2=1176$ MHz, and the output bandwidth is 6 MHz. Thus, the output frequency of interest is 41 MHz to 47 MHz. In this example, there is a spur (46 MHz) resulting from the tenth harmonic of $f_{LO1}$ (10×1289) and the eleventh harmonic of $f_{LO2}$ (11×1176) that falls within the output bandwidth (10×1289−11×1176=−46.0).

Existing spur-avoidance routines can require the calculation of all $n^2$ possible spur frequencies to compare the value of each spur to the output bandwidth as in equation (11) below. When this equation is true, there is a spur within the output band.

$$||f_{OUT}-|f_{SPUR}|| \leq \frac{f_{BW}}{2} \quad (11)$$

Searching n=11, and as many as n=15, harmonics is not uncommon. Accordingly, it can readily be appreciated that analysis using existing spur-avoidance routines can be not only be time consuming but processor intensive.

FIG. 5 shows the results of searching for the spur described above, using common methods and checking for n=15 harmonics. When any spur is detected, no further calculation is necessary. This method requires calculating 146 spur frequencies to be compared with the output frequency. Indeed, when no spur is present, the usual situation, it may be necessary to examine all $n^2$ frequencies, which in this case is 225 calculations.

FIG. 6 shows the results of determining the smallest harmonics greater than the band edges to detect the spur. Only 38 values are computed in the illustrated example before a spur is detected between $m_A$ and $m_B$ associated with the $10^{th}$ harmonic of $f_{LO1}$ and the $11^{th}$ harmonic of $f_{LO2}$. If there is no spur in the band at all, a maximum of 4n (where n, is the number of harmonics to be checked) values are calculated. In this case 60 calculations would be the maximum number. However, since the calculated $m_X$ value reflects the number of $f_{LO2}$ harmonic larger than the band edge and the $m_X$ values only increase, for higher vales of n, the scan can be terminated as soon as the value of $m_D$ matches or exceeds $n_{MAX}$, meaning that it will seldom require the calculation of all 60 values.

Additionally, if the values of $m_A$ and $m_D$ are computed first and $m_A=m_D$, then it is not necessary to calculate the $m_B$ and $m_C$ values (since they must also be the same), which reduces the number of calculations in FIG. 6 from 38 to 21.

Additional optimization to the above algorithm may be obtained by determining the first harmonic of $f_1$ that can possibly contribute to an interfering spur ($n_O$), allowing any calculations for lower harmonics of $f_1$ to be eliminated. In implementing embodiments of the invention including such further optimization, local oscillator frequencies ($f_1$ and $f_2$) are selected such that the difference between the LO frequencies ($f_1-f_2$) is greater than the highest frequency in the output band ($f_{OUT}+f_{BW}/2$). Stated another way:

$$n \times f_1 - m \times f_2 > f_{OUT} + \frac{f_{BW}}{2}, \quad \text{where } n = m = 1 \quad (12)$$

Since $f_1 > f_2$, and therefore, $n \times f_1 > n \times f_2$, it follows that equation (12) is also true for all values of m that are less than or equal to n. Therefore $$n \times f_1 - m \times f_2 > f_{OUT} + \frac{f_{BW}}{2}, \quad \text{for all } n \geq m \quad (13)$$

This means that no LO-related spurs will be created in the output bandwidth when $m \leq n$, or conversely, all spurs will occur when $m > n$. The first possible spur cannot occur until (at least) $m=n+1$.

The above knowledge can be combined with the fact that, by definition, all interfering spurs must be larger than band edge A (see FIG. 3), to determine the lowest harmonic of $f_1$ which needs to be examined ($n_O$). Combining the equation for the first possible spur (from equation (1)) and the value of band edge A (equation (2)) produces the following relationship describing the first harmonic ($n_O$) of interest:

$$n \times f_1 - (n+1) \times f_2 > -f_{out} - \frac{f_{BW}}{2} \quad (14)$$

Solving this equation for n yields the lowest harmonic of $f_1$ that can produce spurs:

$$n > \frac{f_2 - f_{OUT} - \frac{f_{BW}}{2}}{f_1 - f_2} \quad (15)$$

Since only integer harmonics are meaningful and n is the minimum harmonic of $f_1$ that may produce a spur, the ceiling function ($\lceil \; \rceil$) can be applied to the value of n to determine $n_O$:

$$n_O = \left\lceil \frac{f_2 + A}{f_1 - f_2} \right\rceil \quad (16)$$

In the example above, where $f_{LO1}=1289$ MHz and $f_{LO2}=1176$ MHz, the first harmonic of interest is n=10. When determining the smallest spur larger than each band edge according to embodiments of the present invention and starting with the calculated minimum harmonic of $f_1$ as determined above, the presence of the interfering spur of the example of FIG. 6 determined by the two additional calculations, e.g., $m_A$ and $m_D$, it is only necessary to calculate 2 values to detect the existence of the interfering spur.

Summarizing the above discussion, if the two LO frequencies are farther apart than the output bandwidth, which is nearly always the case, then the only spur which could occur is when n (the multiplier of the LO1 harmonic) is a larger number than the LO2 harmonic, or where n is greater than m. This is discussed with respect to equation (12) and equation (13). By accepting that fact and looking back at FIGS. 3 and 4, it can be seen that after frequency A is passed (whatever that frequency is) there cannot be any more spurs resulting in bands 20 and 21 as all the spurs will be larger in frequency than band edge A. Equations (14), (15), and (16) address this fact and allow for the determination of the first harmonic of LO1 that can produce a spur. In all the other cases LO1 is small enough such that when even the very first LO2 is subtracted, the result will be less than the frequency of band edge A, which is the lowest frequency we are interested in. Taking this all into consideration, equation (16) emerges which produces an initial LO1 harmonic of interest.

FIG. 7A shows the steps of a method for determining if particular LO frequencies result in undesired spurs (spurs in an output band) are present according to an embodiment of the present invention. Step 701 determines the band edges for the tuner. It should be appreciated that, in most situations, band edge numbers are constant values that do not change, so they only need to be calculated one time for a particular implementation. Step 702 calculates no, the first $f_1$ harmonic of interest, to thereby optimize the number of calculations made in determining the presence of an undesired spur. According to the illustrated embodiment, the harmonic of $f_1$ for spur analysis (n) is set to the calculated first harmonic of interest ($n_O$).

Step 703 calculates the smallest harmonic of $f_2$ that is associated with a spur greater than band edge A ($m_A$) and the smallest harmonic of $f_2$ that is associated with a spur greater than band edge D ($m_D$) for the selected value of n. At step 704 a comparison is made with respect to the calculated harmonics to determine if it is possible that a spur is present in the bands of interest. If $m_A=m_D$ then no spur can be present in the bands of interest so processing according to the illustrated embodiment proceeds to step 709. If $m_A \neq m_D$ a spur exists between distal band edges A and D and, therefore, may be present in the bands of interest. Accordingly, processing according to the illustrated embodiment proceeds to step 705 for further spur analysis.

Step 705 calculates the smallest harmonic of $f_2$ that is associated with a spur greater than band edge B for the selected value of n. At step 706 a comparison is made with respect to the calculated harmonics to determine if a spur is present in a first band of interest (the band defined by band edge A and band edge B). If $m_A \neq m_B$ then it is determined that an undesirable spur exists and spur determination processing with respect to the pair of LO frequencies ($f_1$ and $f_2$) stops. If $m_A=m_B$ then no spur is present in the first band of interest, but the spur between band edges A and D (as determined at step 704) may be present in a second band of interest (the band defined by band edge C and band edge D). Accordingly, processing according to the illustrated embodiment proceeds to step 707 for further spur analysis.

Step 707 calculates the smallest harmonic of $f_2$ that is associated with a spur greater than band edge C for the selected value of n. At step 708 a comparison is made with respect to the calculated harmonics to determine if a spur is present in the second band of interest. If $m_C \neq m_D$ then it is determined that an undesirable spur exists and spur determination processing with respect to the pair of LO frequencies ($f_1$ and $f_2$) stops. If $m_C=m_D$ then no spur is present in the second band of interest and, therefore, the spur between band edges A and D (as determined at step 704) must be out of band between band edges B and C. Accordingly, processing according to the illustrated embodiment proceeds to step 709.

At step 709 a determination is made as to whether the smallest harmonic of $f_2$ that is associated with a spur greater than band edge D ($m_D$) for the selected value of n is greater than or equal to a maximum harmonic ($n_{MAX}$) of $f_1$ for analysis, e.g., $n_{MAX}$ may be established at 15 for relatively fast tuner circuits. If the smallest harmonic of $f_2$ corresponding to band edge D ($m_D$) for the selected value of n is greater than or equal to the maximum harmonic, then no further spur analysis is performed according to the illustrated embodiment as the pair of LO frequencies ($f_1$ and $f_2$) do not have spurs which are present in the bands of interest. If the smallest harmonic of $f_2$ corresponding to band edge D ($m_D$) for the selected value of n is less than the maximum harmonic, then processing proceeds to step 710 for spur analysis with respect to a next harmonic of $f_1$ (a next selected value of n).

At step 710 the harmonic of $f_1$ (n) is incremented. Thereafter, steps 703-710 are repeated with respect to the next set of spurs.

Figure 7B:
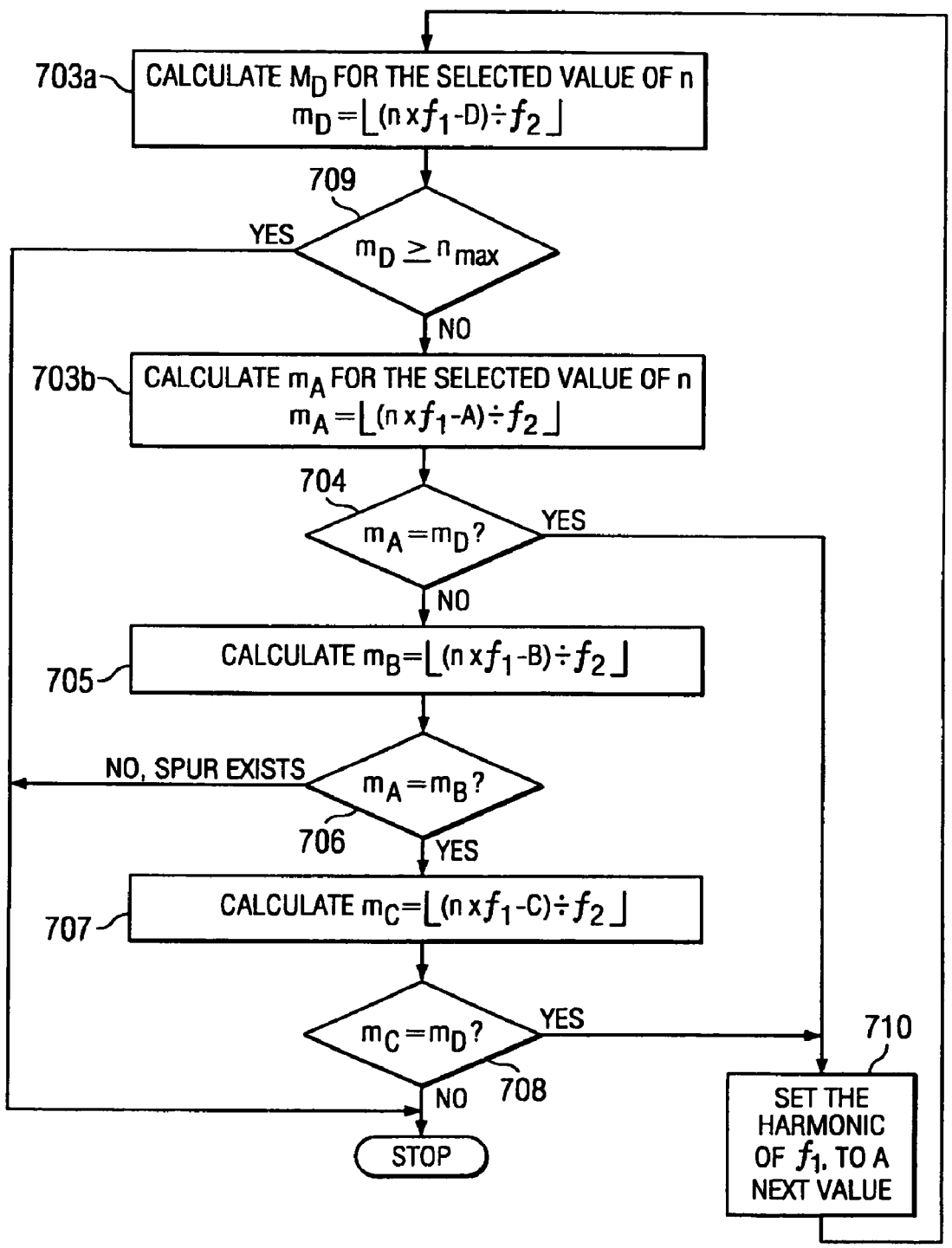
FIG. 7B shows a variation of a method of practicing concepts of the present invention of FIG. 7A.

FIG. 7B shows a variation to the embodiment of FIG. 7A in which the number of steps utilized in determining LOs having interfering spurs associated therewith may be reduced. The steps of FIG. 7B would replace steps 703-710 of FIG. 7A, providing a determination with respect to $m_D$ reaching a maximum harmonic ($n_{MAX}$) earlier in the algorithm. Although the steps of FIG. 7B provide substantially the same calculations and comparisons as those of FIG. 7A (it being appreciated that features of step 703 in FIG. 7A are divided among steps 703a and 703b of FIG. 7B), calculations and/or comparisons of several steps may be avoided according to the embodiment of FIG. 7B due to the earlier determination with respect to the maximum harmonic.

FIG. 8 shows device 80 in which tuner 81 in conjunction with demodulator 83 uses the concepts taught herein to adjust LO frequencies for selectively tuning signals from a plurality of frequency division channels received via antenna 87 and/or cable system 88, via input 86, for use by using device 82. For example, using device 82 may comprise a television set, personal computer, radio, or other device receiving digital and/or analogue signals via tuner 81 and demodulator 33. Accordingly tuner 81 and demodulator 83 may comprise a system such as a set-top cable box, cable modem, video tuner expansion card, etcetera, or may comprise a portion of using device 82.

Adjustment of LO frequencies used by tuner 81 may be to select a particular carrier frequency for conversion to a particular output. IF of tuner 81 for further processing of the signal, such as by demodulator 83. This adjustment could be controlled by processor and/or memory on tuner 80 (not shown) or tuner 81 could receive control signals (or receive the actual LO frequencies) from an external source, such as demodulator 83 having contained therein processor 84 and memory 85. Communications can occur, for example, over connection 801 which is typically a wire connection but could be wireless.

Tuner 81 would typically receive input channels from antenna 87 and/or cable system 88 over input 86. Demodulator 83 would accept the output of tuner 81 (and/or provide input to tuner 81) and would provide signals to using device 82 integral therewith or separate therefrom.

As a new (different) carrier frequency is selected (a new channel is selected), the LO frequencies of tuner 81 are adjusted to turn to the newly selected carrier frequency. However, these LO frequencies must be carefully chosen to avoid spurious signals appearing in the output IF of tuner 81. This is, although a number of LO frequencies may provide conversion of a signal from a particular RF carrier frequency to a particular IF frequency, many such LO frequency combinations will have spurs associated therewith which also fall within the IF frequency output band. Accordingly, before implementation of a particular LO frequency combination for tuning a desired signal by tuner 81, the LO-related spurs are analyzed for undesired spurs. In device 80 of the illustrated embodiment, selection of LO frequencies and the associated spur analysis is done dynamically, such as at the time of channel selection. Accordingly, the concepts of the present invention are employed to minimize delay in tuning to selected channels.

One advantage of systems and methods of the present invention is time savings for alignment, when a tuner is used over a wide range of frequencies. In such a situation it is important to find the LO spurs quickly with as few calculations as possible. In the example of a set top box or a cable box, these calculations are made every time a channel is changed. In such a situation, when the button for a channel change is pushed, the system goes through the software looking for the spurs for that new channel and must calculate what the LOs should be that will tune that channel and yield no spurs on the output. Since the calculations must be the same for all situations (because of certification processes) it is not easy to change calculation procedures. Also, since the same tuner system serves different markets, having different frequencies, it is difficult to change calculation procedures on a market by market basis. The concepts taught herein allow a tuner to be certified once and have that same tuner with any channel lineup. Also, since this procedure could run on an embedded processor, such as processor 84 (FIG. 8) having limited memory capacity, with limited speed, such as memory 85, it is important to reduce calculations for spurs as discussed herein.

Moreover, systems and methods of the present invention are also helpful in applications that do a lot of channel changing, for example, sweeping of channels in a cable modem, such as shown in FIG. 8. When a cable modem starts, it normally sweeps through the channel spectrum to find the signal that it is looking for. This tuning of the tuner may be done hundreds of times at different frequencies to find the correct channel. Some cable modems actually tune through every MHz looking for more channels which could send information downstream to the cable modem. These modems typically do not know ahead of time what the channel lineup is. When the modem finds a proper channel it uses that channel and obtains information from the head end indicating where each channel resides.

Note that while the embodiments discuss local oscillator frequencies, the inventive concepts would be applicable to any frequency interference sensitive circuit or system where the harmonics of frequencies could add spurs (or extraneous frequencies) into a circuit at specific frequencies.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for assisting in the determination of non-interfering local oscillator (LO) frequencies ($f_1$ and $f_2$) in a dual conversion tuner system, said method comprising:

determining band edges A, B, C, and D of a system output band and its image using the formulae $$A = -f_{OUT} - f_{BW}/2$$

$$B = -f_{OUT} + f_{BW}/2$$

$$C = f_{OUT} - f_{BW}/2$$

$$D = f_{OUT} + f_{BW}/2,$$

where $f_{OUT}$ is the system output pass band center frequency and $f_{BW}$ is the bandwidth of the system output pass band;

for a selected harmonic of $f_1$, calculating a smallest harmonic of $f_2$ greater than band edge A, $m_A$, and a smallest harmonic of $f_2$ greater than band edge D, $m_D$, using the formulae $$m_A = \lfloor (n \times f_1 - A) \div f_2 \rfloor$$

$$m_D = \lfloor (n \times f_1 - D) \div f_2 \rfloor,$$

where n is the selected harmonic of $f_1$; and determining if $m_A = m_D$.

2. The method of claim 1, further comprising:

if $m_A \neq m_D$, calculating $m_B$ using the formula $$m_B = \lfloor (n \times f_1 - B) \div f_2 \rfloor; \text{ and}$$

determining if $m_A \neq m_B$.

3. The method of claim 2, further comprising:

if $m_A \neq m_B$, concluding that frequencies $f_1$ and $f_2$ result in an interfering spur.

4. The method of claim 2, further comprising:

if $m_A = m_B$, calculating $m_C$ using the formula $$m_C = \lfloor (n \times f_1 - C) \div f_2 \rfloor; \text{ and}$$

determining if $m_C \neq m_D$.

5. The method of claim 4, further comprising:

if $m_C \neq m_D$, concluding that frequencies $f_1$ and $f_2$ result in an interfering spur.

6. The method of claim 4, further comprising:

if $m_C = m_D$, determining if $M_D \geq n_{MAX}$, where $n_{MAX}$ is a maximum harmonic to be considered; and if $M_D \geq n_{MAX}$, concluding for the selected harmonic of $f_1$ that frequencies $f_1$ and $f_2$ do not result in an interfering spur.

7. The method of claim 6, further comprising:

if $m_D < n_{MAX}$, selecting a next harmonic of $f_1$ and repeating, for said next selected harmonic of $f_1$, said calculating a smallest harmonic of $f_2$ greater than band edge A, $m_A$, and a smallest harmonic of $f_2$ greater than band edge D, $m_D$, and determining if $m_A=m_D$.

8. The method of claim 1, further comprising:
calculating a first $f_1$ harmonic ($n_O$) using the formula $$n_O = \left\lceil \frac{f_2 + A}{f_1 - f_2} \right\rceil,$$

where $n_O$ is a limit on the harmonics of $f_1$ considered according to the method.

9. A system for assisting in the determination of non-interfering local oscillator (LO) frequencies ($f_1$ and $f_2$) in a dual conversion tuner system, said system comprising:
means for determining band edges A, B, C, and D of a system output band and its image using the formulae $A=f_{OUT}-f_{BW}/2$ $B=-f_{OUT}+f_{BW}/2$ $C=f_{OUT}-f_{BW}/2$ $D=f_{OUT}+f_{BW}/2$, where $f_{OUT}$ is the system output pass band center frequency and $f_{BW}$ is the bandwidth of the system output pass band;
means for calculating, for a selected harmonic of $f_1$, a smallest harmonic of $f_2$ greater than band edge A, $m_A$, and a smallest harmonic of $f_2$ greater than band edge D, $m_D$, using the formulae $m_A = \lfloor (n \times f_1 - A) \div f_2 \rfloor$ $m_D = \lfloor (n \times f_1 - D) \div f_2 \rfloor$ where n is the selected harmonic of $f_1$; and
means for determining if $m_A=m_D$.

10. The system of claim 9, further comprising:
means for calculating, if $m_A \neq m_D$, $m_B$ using the formula $m_B = \lfloor (n \times f_1 - B) \div f_2 \rfloor$; and means for determining if $m_A \neq m_B$.

11. The system of claim 10, further comprising:
means for concluding if, $m_A \neq m_B$, that frequencies $f_1$ and $f_2$ result in an interfering spur.

12. The system of claim 10, further comprising:
means for calculating, if $m_A=m_B$, $m_C$ using the formula $m_C = \lfloor (n \times f_1 - C) \div f_2 \rfloor$; and means for determining if $m_C \neq m_D$.

13. The system of claim 12, further comprising:
means for concluding if, $m_C \neq m_D$, that frequencies $f_1$ and $f_2$ result in an interfering spur.

14. The system of claim 12, further comprising:
means for determining, if $m_C=m_D$, if $m_D \geq n_{MAX}$, where $n_{MAX}$ is a maximum harmonic to be considered; and means for concluding, if $m_D \geq n_{MAX}$, for the selected harmonic of $f_1$ that frequencies $f_1$ and $f_2$ do not result in an interfering spur.

15. The system of claim 14, further comprising:
means for selecting, if $m_D < n_{MAX}$, a next harmonic of $f_1$ and repeating, for said next selected harmonic of $f_1$, said calculating a smallest harmonic of $f_2$ greater than band edge A, $m_A$, and a smallest harmonic of $f_2$ greater than band edge D, $m_D$, and determining if $m_A=m_D$.

16. The system of claim 9, further comprising:
means for calculating a first $f_1$ harmonic ($n_O$) using the formula $$n_O = \left\lceil \frac{f_2 + A}{f_1 - f_2} \right\rceil,$$

where $n_O$ is a limit on the harmonics of $f_1$ considered.

17. A method for assisting in the determination of non-interfering local oscillator (LO) frequencies ($f_1$ and $f_2$) in a dual conversion tuner system, said method comprising:
determining band edges A, B, C, and D of a system output band and its image, wherein band edge A comprises a lowest frequency band edge of band edges A, B, C, and D and band edge D comprises a highest frequency band edge of band edges A, B, C, and D;
for a selected harmonic of $f_1$, calculating a smallest harmonic of $f_2$ greater than band edge A, $m_A$, and a smallest harmonic of $f_2$ greater than band edge D, $m_D$; and
determining if $m_A=m_D$.

18. The method of claim 17, wherein said determining band edges A, B, C, and D uses the formulae $A=-f_{OUT}-f_{BW}/2$ $B=-f_{OUT}+f_{BW}/2$ $C=f_{OUT}-f_{BW}/2$ $D=f_{OUT}+f_{BW}/2$, where $f_{OUT}$ is the system output pass band center frequency and $f_{BW}$ is the bandwidth of the system output pass band.

19. The method of claim 17, wherein said calculating said smallest harmonic of $f_2$ greater than band edge A, $m_A$, and said smallest harmonic of $f_2$ greater than band edge D, $m_D$, uses the formulae $m_A = \lfloor (n \times f_1 - A) \div f_2 \rfloor$ $m_D = \lfloor (n \times f_1 - D) \div f_2 \rfloor$, where n is the selected harmonic of $f_1$.

20. The method of claim 19, further comprising:
if $m_A \neq m_D$, calculating $m_B$ using the formula $m_B = \lfloor (n \times f_1 - B) \div f_2 \rfloor$;

determining if $m_A \neq m_B$; and
if $m_A \neq m_B$, concluding that frequencies $f_1$ and $f_2$ result in an interfering spur.

* * * * *